US006996515B1

(12) United States Patent
Foltin et al.

(10) Patent No.: US 6,996,515 B1
(45) Date of Patent: *Feb. 7, 2006

(54) ENABLING VERIFICATION OF A MINIMAL LEVEL SENSITIVE TIMING ABSTRACTION MODEL

(75) Inventors: Martin Foltin, Fort Collins, CO (US); Brian Foutz, Ithaca, NY (US); Sean Tyler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 754 days.

This patent is subject to a terminal disclaimer.

(21) Appl. No.: 09/927,204

(22) Filed: Aug. 10, 2001

(51) Int. Cl.
*G06F 17/50* (2006.01)

(52) U.S. Cl. .................... 703/19; 716/1; 716/2; 716/3; 716/4; 716/5; 716/6; 716/18

(58) Field of Classification Search .................. 703/19, 703/21; 716/6, 11
See application file for complete search history.

(56) References Cited

U.S. PATENT DOCUMENTS

| | | | | |
|---|---|---|---|---|
| 5,933,356 | A * | 8/1999 | Rostoker et al. | 703/15 |
| 5,956,257 | A | 9/1999 | Ginetti et al. | 364/490 |
| 6,023,568 | A * | 2/2000 | Segal | 716/6 |
| 6,158,022 | A * | 12/2000 | Avidan | 714/33 |
| 6,453,436 | B1 * | 9/2002 | Rizzolo et al. | 714/726 |
| 6,581,197 | B1 * | 6/2003 | Foutz et al. | 716/6 |
| 6,604,227 | B1 * | 8/2003 | Foltin et al. | 716/6 |
| 6,609,233 | B1 * | 8/2003 | Foltin et al. | 716/6 |

OTHER PUBLICATIONS

Kulshreshtha et al., "Transistor-level Timing Anaylsis using Embedded Simulation" IEEE 2000 p. 344-349.*
Albrecht et al., "Cycle Time and Slack Optimization for VLSI-chips" p. 232-238 1999 IEEE/ACM International Conference on Computer-aided Design.*
Chen et al., "A New Framework for Static Timing Analysis, Incremental Timing Refinement,and Timing Simulation" IEEE Dec. 2000 p. 102-107.*
Huelsbergen et al., "Using the Run-Time Sizes of Data Structures to Guide Parallel-Thread Creation" ACM Conference 1994. p. 1-12.*

* cited by examiner

*Primary Examiner*—Paul L. Rodriguez
*Assistant Examiner*—Thomas Stevens

(57) ABSTRACT

A method and a corresponding apparatus for verifying a minimal level sensitive timing abstraction model provides for an extension of the timing abstraction model. The method modifies and runs the timing abstraction model with certain stimulus to establish whether the timing results with the timing abstraction model are identical to the timing result with the modeled circuit. The timing abstraction model extension, which enables verification of the timing abstraction model, only negligibly increases the size of the timing abstraction model, thus keeping STA runtimes short and the memory requirements small.

18 Claims, 7 Drawing Sheets

ENABLING VERIFICATION OF A MINIMAL LEVEL SENSITIVE TIMING ABSTRACTION MODEL

TECHNICAL FIELD

The technical field relates to timing analysis systems, and, in particular, to static timing analysis of a digital circuit.

BACKGROUND

A wide variety of design verification tools are required to produce a working integrated circuit from a functional specification. These tools analyze different parameters of a circuit design to insure that the circuit will function properly after the circuit is fabricated. One important set of verification tools includes timing analysis tools, which are widely used to predict the performance of very large scale integrated (VLSI) designs. Often, timing analysis determines the best path for a designer to pursue or helps to optimize the overall circuit design. In digital circuits, timing considerations can be critical to proper performance. Timing analysis tools may be either static or dynamic.

Dynamic timing analysis (DTA) tools provide the most detailed and accurate information obtainable concerning the performance of a circuit. With DTA, a design engineer must provide sets of waveforms to simulate the conditions under which a circuit will operate. This type of timing analysis is often generated through simulation of a circuit by simulation programs that operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These DTA programs typically operate by solving matrix equations relating to the circuit parameters, such as voltages, currents, resistances and capacitances. Additionally, such circuit simulation approaches to performance analysis are pattern dependent, or stated another way, the possible paths and the delays associated with the paths depend upon a state of a controlling mechanism or machine of the circuit being simulated. Thus, the result of a DTA depends on the particular test pattern, or vector, applied to the circuit.

While such circuit simulation programs and DTA tools provide high accuracy, long simulation times are required because a large number of patterns must be simulated since the best and worst case patterns are not known before the simulation occurs. The number of simulations which must be performed is proportional to $2^n$, where "n" is a number of inputs to the circuit being simulated. Thus, for circuits having a large number of inputs, DTA is not always practical.

Static timing analysis (STA) tools are also widely used to predict the performance of VLSI designs. In STA, a design engineer applies stimulus only at each block input, not at base waveform. Additionally, each signal is assumed to switch independently in each machine cycle, i.e., static timing analyzer is waveform independent and simulates the most critical arrival time at each node in the circuit.

In STA, since only the best and worst possible rising and falling times are computed for each signal in the circuit, such times are typically determined in a single pass through a topologically-sorted circuit. When referring to a topologically-sorted circuit, a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., IBM J. Res. Develop., Vol. 26, No. 1, pp. 100–105 (1982).

Timing models used in timing analysis are blocks of computer data that can be used to recreate the timing behavior of an electronic circuit. The size of timing models should be as small as possible for a given complexity of circuit, while maintaining the accuracy of the timing model. In general, a smaller timing model will not only require less space in a computer memory, but also will be faster for a computer to evaluate. Often, timing model accuracy is sacrificed to shrink the timing model and speed its evaluation. This is especially important for large timing models that represent an entire subcircuit of an electronic system.

A popular technique for shrinking a timing model involves creating port-based timing models as opposed to path-based timing models. Port-based timing models analyze an electronic circuit to isolate and maintain only the timing behavior that can be observed at the circuit's connections, often referred to as ports, to surrounding circuits. Any timing behavior of a circuit that is internal to the circuit is discarded, leaving only the information that is essential to verifying the timing behavior of the circuit in the context of surrounding circuits. The port-based timing models have been used in both timing simulation and STA. The timing models are accurate, and generally provide good compression of timing model size.

In port-based timing modeling, the electronic circuit is analyzed to determine the longest time for an electronic signal to pass from each input port to each output port. Often the shortest time is determined as well. An edge triggered latch in the circuit, controlled by a clock signal, acts much like an internal port and is also considered a start point and an end point for electronic signals. At the instant the value of its clock signal changes, the edge triggered latch passes the value of its data signal to its output signal. At other times, the edge triggered latch holds the value of its output signal constant. Analysis is also done to determine the longest time for an electronic signal to pass from each input port to the input signals of each edge triggered latch and from the output signal of each edge triggered latch to each output port.

In true port-based timing models, the internal latch nodes are abstracted away and only the longest time for an electronic signal to arrive at each given output port is calculated. Often the shortest time is calculated as well. The latest (and often also the earliest) allowed time for signal to arrive at each given input port is also calculated. For circuits with edge triggered latches, these calculations are rather simple. The longest time for a signal to arrive at the output port is the time when the clock signal changes on the edge triggered latch that is connected to the output port by a combinational circuitry, plus the time the signal passes from the latch to the output port. If more edge triggered latches are connected to the output port by a combinational circuitry, the latest signal arrival from all the latches is considered. The latest allowed time for the signal to arrive at the input port is the time when the clock signal changes on the edge triggered latch that is connected to the input port by a combinational circuitry, minus the time the signal passes from the input port to the latch, minus the setup time for the latch (due to the physical characteristics of the latch electronic circuitry, the signal value at the latch input must be stable before the clock signal changes). If more latches are connected to the input port by a combinational circuitry, the latest time for the signal to arrive at the input port is the minimum from the latest times determined for the individual latches as described above. The latch that determines the minimum time is referred to as the most critical latch. PathMill's Black box timing model performs these calculations. However, the calculations become more complicated for circuits that use level triggered latches, and PathMill's Black box cannot model well such circuits.

Many digital circuits use level triggered latches, i.e., transparent latches, in place of edge triggered latches. Like an edge triggered latch, a level triggered latch is controlled by a clock signal. The edge triggered latches are active only at the instant the clock signal changes, while the level triggered latches can be active at any time that the clock signal remains at a high voltage.

The level triggered latches in a circuit can time borrow amongst themselves. Time borrowing is possible when the combinational logic between two latches requires more time than the clock period to compute a stable value. However, if the logic following the second latch requires less than an entire clock period to compute a stable value, then the value computed by the first pair of latches need not become stable until some time after the clock signal goes high. The second set of logic will still have enough time to compute a stable value, even though its calculations did not begin until some time after the clock signal went high. Time borrowing is an essential technique for latch-based design. High performance or custom designed circuits, such as modern CPUs, rely on level triggered latches to take advantage of the time borrowing that helps reach high clock frequencies. Timing models that do not support transparency are inadequate for such designs.

When the clock signal transitions from high to low the level triggered latch latches the input data and holds that value on the output port until the clock transitions back to high again. The input data is fed to the level triggered latch via the latch's data pin. The output of the latch is available on the latch's output pin. The clock signal is connected to the latch using the latch's clock pin.

Due to the physical characteristics of the electronic circuitry from which physical latches are implemented, the transition between when the latch is transparent and when the latch holds its value is not instantaneous. Therefore, the value on the data pin must be available a certain amount of time before the clock signal transitions to a low voltage. This time is called the setup time. Routines that verify that the data is available early enough to meet the setup time are called setup checks and violations are called setup violations. In addition to the setup time, the data value must remain constant for a certain amount of time after the clock transitions to low. This time is called the hold time. Routines that verify that the data is available long enough to meet the hold time are called hold checks and violations are called hold violations. If a setup or a hold violation occurs, the latch might not contain a valid value. Thus, it is important that timing models accurately represent setup and hold times.

In a timing model block for a circuit, a signal arriving at the output ports depends on the signal arrival time at the input ports, referred to as stimulus. In a stimulus dependent timing model, the parameters of the timing model are limited to certain intervals of the arrival times. If the stimulus is outside of the interval, the timing model does not properly represent the circuit and the model needs to be rebuilt each time when the stimulus change. In a stimulus independent timing model, the timing model works irrespective of when the signal arrives at the input ports, i.e., always generating correct arrival at the output port.

Currently available timing models that can be input into general STA tools fall into three categories. PathMill's conventional Black box timing models are port-based and stimulus independent. However, the conventional Black box timing models do not support transparency. PathMill's new transparent Black box timing models are port-based with limited support of transparency. However, the new Transparent Black box timing models are stimulus dependent. Pathmill's Gray box timing models support transparency and are stimulus independent. However, the Gray box timing models are not port-based.

For circuits with level triggered latches, the Transparent Black box timing models are significant improvement over the conventional Black box timing models. The latest allowed time for the signal to arrive at a given input port, i.e., the time before setup violation occurs, is calculated, considering not only the first latch connected to the given input port by a combinational circuitry. The second latch or other sequential element that is connected to the first latch by a combinational circuitry is also considered, as well as the third and any successive latch that may be on a transparent path from the given input port. Considering all latches is important because, in circuits with transparent latches, the second, third, or other latch on the transparent path from an input port may be more critical than the first latch, i.e., the second, third, or other latch determines the latest time on the input port before the setup violation occurs, employing similar calculation procedure as described earlier for the first latch in the conventional Black box timing model. Similarly, the longest time for an electronic signal to arrive at the output port is calculated, considering not only the last latch connected to the output port by a combinational circuitry, but also the previous latch that is connected to the last latch by a combinational circuitry, as well as any earlier latch that may be on a transparent path to the output port.

However, in the Transparent Black box timing model, the signal arrival at the output port on a transparent path is correct only for the input port stimulus that was used to build the model. When the input stimulus changes, the model needs to be rebuilt or the signal arrivals at output ports on transparent paths may be wrong, since the Black box timing model cannot represent the unique clock-controlled connectivity between the input and the output ports on a transparent path. Instead, the output signal arrival time on the most critical transparent path is hard-coded in the model, which makes the model valid only for a particular input stimulus.

To ensure that the timing model is accurate, a verification algorithm is typically needed to compare the quality or accuracy of the timing results for a timing run on the timing model with a corresponding timing run on the modeled circuit.

PathMill's Gray box timing model retains all internal clock-controlled nodes, and is therefore easy to verify. Each path in Gray box timing model has a corresponding path in the modeled circuit, and the paths in the timing model and the modeled circuit have the same starting and ending node names. However, for circuit blocks with a large number of latches, Gray box timing models have a large number of internal nodes and time-arcs, resulting in a large number of timing checks to be performed and a large number of paths to be traced in a STA run. All timing checks carried out on a lower level of hierarchy need to be repeated again on higher hierarchy levels, because no sequential nodes are abstracted away when moving from one level of hierarchy to the next level. As a result, the large number of timing checks leads to long STA runtimes and large memory requirements, especially on higher hierarchy levels and full chip levels, which, in turn, results in slow roll-up/roll-down times and a need to manually simplify the timing model so that the STA on larger blocks does not run out of memory.

SUMMARY

A method for verifying a minimal level sensitive timing abstraction model includes extracting a plurality of parameters from a modeled circuit that includes sequential elements, such as, latches or domino logic, controlled by clock elements and creating an echo-circuit that represents the plurality of parameters with nodes and time arcs, i.e., nets with delays. The echo-circuit is lightweight, can be input into any static timing analysis (STA) tools, and may enable a signal to propagate from an input port to an output port only if the signal arrives at the output port later than a clock signal from a most critical clock element associated with the output port, i.e., the clock element from which signal in the modeled circuit arrives at the output port at the latest time. The method further includes identifying relevant timing paths in the echo-circuit that are associated with the plurality of parameters, identifying paths in the modeled circuit that should correspond to the relevant timing paths in the echo-circuit, and comparing the relevant timing paths in the echo-circuit with the corresponding paths in the modeled circuit. The relevant timing paths in the echo-circuit and in the modeled circuit may be identified and selected independently of each other to generate a more complete and reliable verification.

The method for verifying the minimal level sensitive timing abstraction model provides for an extension of the timing abstraction model. The method modifies and runs the timing abstraction model with certain stimulus to establish whether the timing results with the timing abstraction model are identical to the timing result with the modeled circuit. The timing abstraction model extension, which enables verification of the timing abstraction model, only negligibly increases the size of the timing abstraction model, thus keeping STA runtimes short and the memory requirements small.

DESCRIPTION OF THE DRAWINGS

The preferred embodiments of a method for verifying a minimal level sensitive timing abstraction model will be described in detail with reference to the following figures, in which like numerals refer to like elements, and wherein:

FIGS. 4(*b*) and 4(*c*) illustrate the relationship between clock signals and "set" input signals for the second exemplary modeled circuit illustrated in FIG. 4(*a*);

DETAILED DESCRIPTION

Figure 1:
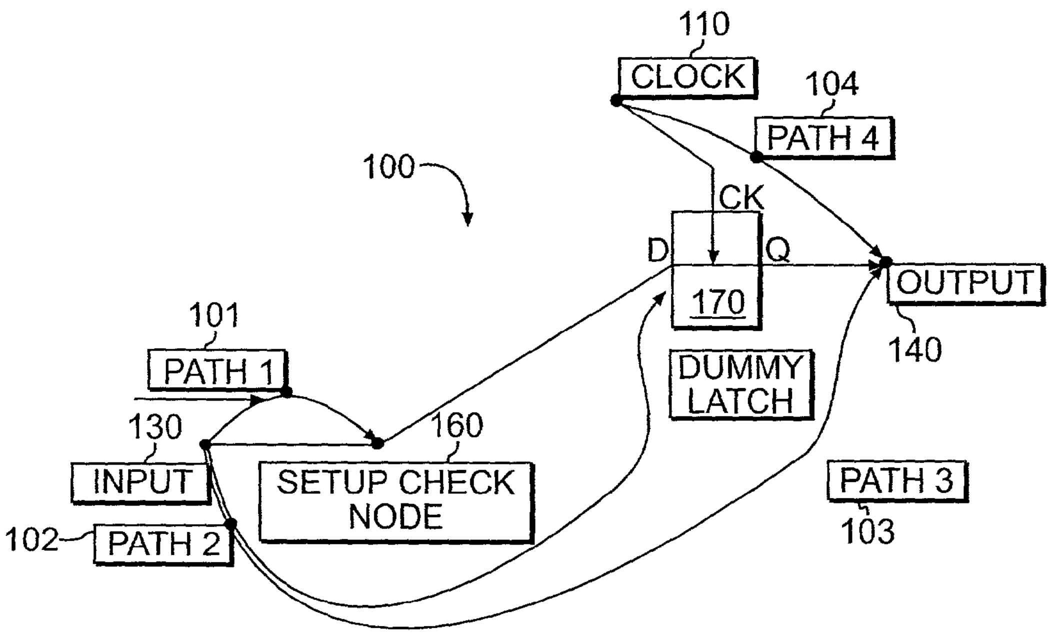
FIG. 1 illustrates exemplary timing paths in an exemplary minimal level sensitive timing abstraction model in a MAX time analysis.

A minimal level sensitive timing abstraction model provides for a minimal representation of a digital circuit block, in the form of an equivalent circuit or connectivity network, with a minimum number of internal nodes. The timing abstraction model supports transparency, is stimulus independent, and can be input into general static timing analysis (STA) tools to efficiently perform timing analysis on large circuits that contain the modeled circuit block. The circuit block represented by the timing abstraction model may contain a combination of sequential and combinational elements, as well as one or more blocks that are themselves this type of timing abstraction model.

The timing abstraction model supports multiple levels of hierarchy and limits timing analysis to most critical paths, i.e., a path from an input port to a setup/hold check node, a path from the input port to a dummy latch node that checks for transparency, a transparent path between the input port and an output port, and a path between a most critical clock element and the output port. The limitation of timing analysis to the most critical paths leads to a significant reduction of the number of internal clock-controlled nodes, which in turn results in significant speed-up of STA runs on large circuits and reduced memory and storage space requirements. Further speed-up of STA runs is achieved by tracing only the most relevant transparent paths to a given output port, i.e., only the paths on which the signal arrives at the output port later than the clock signal from the most critical clock element, which reduces the number of paths fed to the adjacent blocks. The timing abstraction model also simplifies the output from the timing analysis and may shorten a designer's time to analyze STA results.

A method and a corresponding apparatus for verifying the minimal level sensitive timing abstraction model provide for an extension of the timing abstraction model. The method modifies and runs the timing abstraction model with certain stimulus to establish whether the timing results with the timing abstraction model are identical to the timing result with the modeled circuit. The timing abstraction model extension, which enables verification of the timing abstraction model, only negligibly increases the size of the timing abstraction model, thus keeping STA runtimes short and the memory requirements small.

The purpose of the timing analysis is to simulate signal arrival times at different nodes in a digital circuit to assure proper functionality of the circuit. Within the circuit are clock-controlled nodes and nodes that are not controlled by clocks. On the clock-controlled nodes, the signal must arrive within a certain time interval relative to the clock. For example, for an edge triggered latch, the signal must arrive at the latch before the active edge of the clock, and for a level triggered latch, the signal must arrive before the closing edge of the clock, i.e., while the latch is open or in an active level. If the signal does not arrive within this timing interval, a violation occurs and the circuit may not function properly. Timing analysis is a computer simulation of the digital circuit to simulate arrival times on the clock-controlled nodes and to verify that the signal arrives at the nodes within the allowed time interval.

A micro chip containing digital circuits may have millions of elements, such as transistors, gates, resistors, and interconnects represented by resistors and capacitors. Simulation and timing analysis on a full chip level is expensive. Accordingly, a common practice is to divide the chip into blocks and conduct timing analysis on each of the blocks individually. The blocks are given the characteristics of the real circuit, by abstracting away unnecessary information from the circuit and characterizing the circuit by a set of useful parameters.

Port-based timing models involve less timing simulation than path-based timing models. In port-based timing models, the number of nodes scales with the number of ports. In path-based timing models, the number of nodes scales with the number of paths, which is significantly more than the number of ports in a circuit. The more nodes there are, the longer the timing checks take. So the number of nodes determines how fast the timing checks are performed. In an embodiment of the timing abstraction model, which is port-based rather than path-based, the number of timing checks to be performed, i.e., the number of parameters, scales with the number of input ports plus the number of input-to-output port pairs that are connected by transparent paths for at least one input stimulus, which is usually much less than the total number of paths in the circuit.

Accordingly, the speed-up of STA runs that uses the timing abstraction model may be achieved as follows. First, the number of timing checks to be performed in most circuits may be reduced to one check for each input port plus one check for each input-to-output port pair that is connected by a transparent path for at least one input stimulus. Second, each timing check may be performed faster in the port-based timing model than in a path-based timing model, because the number of clock controlled internal nodes in the port-based model is small, i.e., in most circuits the number of clock controlled nodes is equal to number of ports. Therefore, a larger part of this port-based model may be stored in the fast computer memory, i.e., the main memory or the very fast microprocessor cache memory, than in the path-based timing models. Third, only the most relevant transparent paths, i.e., paths on which a signal arrives at the output port later than the latest clock signal, are traced to a given output port, reducing the number of paths fed to the adjacent blocks.

Level triggered latches, which support transparency, can be active when any of their clock signals, i.e., clock elements, remain at a high voltage, while edge triggered latches are active only at the instant the clock signals change. Some level triggered latches are active when the clock signals are at low voltage, instead of high voltage, but the processes are the same. The timing abstraction model has level triggered latches. In the discussion that follows, level triggered latches are transparent when the clock signals are high, but as will be apparent to one skilled in the art, the techniques described also apply to latches that pass values when the clock signals are low. Also, the following paragraphs describe modeling of maximum (long) path STAs, i.e., the paths with the latest signal arrival at input and output ports. As will be apparent to one skilled in the art, the techniques described also apply to minimum (short) path STAs, i.e., the paths with the earliest signal arrival at the input and output ports, except that there are no short transparent paths in the circuit.

An embodiment of the timing abstraction model first extracts a minimal set of characteristics, i.e., parameters, from the modeled circuit in order to simulate timing on the circuit. The parameters include: 1) a required time parameter associated with an input port, i.e., the latest time a signal can arrive at the input port before a setup violation would occur in the modeled circuit on some sequential element, i.e., a latch or a domino logic, connected to the input port by a combinational circuitry and/or a circuitry that consists of one or more transparent sequential elements; 2) a valid time parameter associated with an output port, i.e., the latest time the signal from any clock element arrives at the output port; and 3) an input-to-output delay parameter that represents a time delay a signal passes from the input to the output port on a transparent path.

Next, the timing abstraction model creates an echo-circuit that represents the characteristics and can be input into virtually any STA tool. The echo-circuit may be a timing abstraction model represented in PathMill's Gray box format.

The first characteristic to be extracted is a setup/hold check time, referred to as a required time, associated with a setup/hold check node at each input port in the timing abstraction model. Associating timing checks with the input port do not reduce the universality of the timing abstraction model because STA analysis tools support circuits with setup/hold timing checks attached to any node.

STA uses two different simulations. A simulation for maximum paths, i.e., the setup check, determines the latest time a data signal can arrive at the input port before any violation in the modeled circuit will occur. A simulation for minimal paths, i.e., the hold check, determines if the data signal is stable for a long enough time at the input port. The following paragraphs describe the simulation with respect to the maximum path. However, one skilled in the art should appreciate that the minimal path simulation behaves in a similar fashion, except that there are no transparencies in minimal path simulation because there is no input-to-output path.

As described above, the setup check node checks data arrival at the input port with respect to the required time, which is the latest time the data signal can arrive at the input port before any violation would occur in the modeled circuit. In other words, the setup check node checks if the data signal arrives at the input port early enough so that the most critical clock-controlled node of the modeled circuit, i.e., the most critical latch or other sequential element such as the domino logic, will have no violation. The most critical sequential element in the modeled circuit is the sequential element on which the violation occurs with the earliest time arrival at the input port. The most critical path is the one that fails first, and the setup check node checks the required time that corresponds to the time when the failure occurs on the most critical sequential element.

As an example, a circuit with three latches may have the most critical as the second latch. In this example, 800 picoseconds may be required for a signal to propagate from the input port to the second latch, and the signal may be required to be at the second latch at time 1000 picoseconds or earlier. If the signal arrives at the second latch in the modeled circuit at 1000 picoseconds, which is the latest allowed time, there is no violation. On the other hand, if the signal arrives at 1001 picoseconds, a violation occurs. Since 800 picoseconds are required to propagate the signal from the input port to the second latch, the signal must arrive at the input port within 200 picoseconds.

In general, the setup time, SI, at an input port I can be expressed as:

$$SI = \min_j (SI_j) \tag{1}$$

$$SI_J = SL_J + (\text{Cycle}_J - \text{Cycle}_0)T - \text{Delay}_J, \tag{2}$$

where $SI_J$ is the latest time a signal can arrive at the input port I before violation would occur on a sequential element, i.e., latch or domino logic, $L_J$ in the modeled circuit, $SL_J$ is the latest time signal can arrive at the sequential element $L_J$ before setup violation would occur on the sequential element, $\text{Cycle}_J$ is the clock cycle count on the sequential element $L_J$, $\text{Cycle}_0$ is the cycle count on input I (usually $\text{Cycle}_0=1$), T is the clock cycle time (the clock period) and $\text{Delay}_J$ is the time the signal needs to propagate from the input port I to the sequential element $L_J$.

The setup times $SI_J$ can be obtained, for example, from a Pathmill run with late stimulus at the input port I and a latch_error_recovery feature turned on. The late stimulus is an arbitrarily chosen stimulus, Lstim, that is so late that with a certainty a setup violation will occur on some sequential element in the circuit (usually, Lstim can be any number that is much higher than the clock period T). Then, the setup time $SI_J$ can be expressed as:

$$SI_j = Lstim - \sum_{k=1}^{j-1} Advance_k + Slack_j, \tag{3}$$

where $\text{Slack}_J$ is the timing slack on the sequential element $L_J$ and $\text{Advance}_k$ is the timing adjustment introduced by the latch_error_recovery feature on sequential element $L_k$ that is on the path from the input port I to the sequential element $L_J$.

The setup times $SI_J$, can be obtained from other commercial STA tools in a similar way. For example, the setup times can also be obtained directly from Pathmill's Transparent Black model, if the signal arrival times at output ports are not subjected to any constraints when such model is generated.

The second characteristic to be extracted is an opening time, referred to as a valid time, associated with a dummy latch node attached to each output port. The dummy latch node may be controlled by a derived clock that has an opening edge offset with respect to the opening edge of a clock port. The derived clock typically becomes active at the time corresponding to the latest signal arrival from the clock port to the output port in the modeled circuit. The dummy latch node compares data signal arrival at the output port with the clock signal arrival of the latest clock at the output port. All paths arriving before the latest clock stop at the dummy latch node, i.e., the paths are not transparent and the clock signal goes to the output port instead. If the data signal arrives after the clock signal, the data signal propagates to the output port.

Multiple paths may converge from multiple input ports to one output port, with each path controlled by a different clock. In the timing abstraction model, the dummy latch node enables comparison of the data signal with the latest clock signal. Accordingly, the data signal may be blocked if the signal arrives earlier than any of the clocks converging to the output port. Comparing the paths with the most critical clock significantly reduces the number of paths that arrive at the output port.

In general, the valid time, VO, at an output port O can be expressed as:

$$VO = \max_j (VO_j) \tag{4}$$

$$VO_J = DO_J - (\text{Cycle}_J - 1)T \tag{5}$$

$$DO_J = DC_J + \text{Delay}_J, \tag{6}$$

where $DO_J$ is the signal arrival time at the output port O from clock port $C_J$, $DC_J$ is the signal arrival at a clock port $C_J$, $\text{Delay}_J$ is the time the signal needs to propagate from the clock port $C_J$ to the output port O, $VO_J$ is the time $DO_J$ adjusted to the first clock cycle, Cycles is the clock cycle count on the output port O and T is the clock cycle time (the clock period). Note that the valid time VO calculated from equations (4)–(6) is adjusted to be in the first clock cycle. The offset between the clock port C, and the derived clock controlling the dummy latch node will be set to time $VO-DC_J$. The STA tool will determine whether or not the input signal will pass the dummy latch node in the timing abstraction model based on the valid time and the cycle count on the path from the input port.

The most critical path from clock port to the output port O will have a delay $\text{Delay}_{Jmax}=DO_{Jmax}-DC_{Jmax}$, where $DO_{Jmax}$ is the signal arrival time at the output port O from the most critical clock port $C_{Jmax}$ that determines the valid time according to equation (4).

The clock signal arrival times, $DO_J$, and the clock cycle counts, $\text{Cycle}_J$, can be obtained from any commercial STA tool, such as Pathmill. The clock signal arrival times and the clock cycle counts are stimulus independent because the clock signal propagation is independent on input signal arrival times.

The third characteristic to be extracted is an input-to-output delay, i.e., transparent delay arc. The delay exists only if, for some stimulus, the signal propagates transparently between the input port and the output port. The dummy latch node opens at the valid time and closes at the latest possible signal arrival time from an input port that has a timing path to the output port. This time is determined by required times and path delays. Accordingly, the dummy latch node enables a signal to propagate from the input port to the output port only if the signal arrives at the output port later than a clock signal on the most critical clock controlling the dummy latch node. This is acceptable for STA tools because STA only deals with the most critical path, i.e., the most critical arrival at any given node.

Therefore, all inputs that arrive at the output port before the latest clock are blocked by the dummy latch node and will not propagate to the next block. The blocking of early arrived inputs simplifies output from the timing analysis because only the most relevant transparent paths are considered. More importantly, the timing abstraction model reduces the number of paths fed to the adjacent blocks and speeds-up the STA runs, because, by blocking the number of paths that leave the first block, the total number of paths in the circuit may be decreased significantly. In addition, by limiting timing analysis to the most critical paths, the timing abstraction model simplifies the output from the timing analysis and shortens designer's time to analyze STA results because only the paths that are important are printed in the report.

The input-to-output delays can be obtained from any commercial STA tool, such as Pathmill, when the input stimulus is set to the required time, SI, described above. These characteristics, i.e., the required time, the valid time, and the input-to-output delay, may be obtained from STA analysis as discussed above. Compared with Pathmill's Black box and Transparent Black box timing models, the timing abstraction model described above represents each input-to-output transparent path by an equivalent circuit that consists of time-arcs (or connectivity networks) and clock-controlled (dummy latch) nodes to model signal arrivals at the output ports independently on input stimulus. The equivalent circuit may be designed such that the tracing of false non-transparent paths is avoided and the reported transparent paths are limited to those critical paths that may be important for the designer. In other words, the timing abstraction model is input-stimulus independent and needs to be rebuilt only when the clock waveforms change.

In a VLSI custom design environment, circuits may contain unusual latches or dynamic logic element types, and thus may not be accurately represented by the minimum level sensitive timing abstraction model. A verification mechanism may be needed to compare the quality or accuracy of the timing results for a timing run on the timing abstraction model with a corresponding timing run on the timing circuit.

An embodiment of the method for verifying the timing abstraction model reproduces all timing characteristics of a circuit block that are needed for the timing analysis of a larger circuit containing the circuit block. The method then runs the timing abstraction model with certain stimulus to establish whether the timing results with the timing abstraction model are identical to the timing result with the modeled circuit. The method may be implemented in the form of a computer algorithm that may be executed by the designer to verify the timing abstraction model for the circuit block.

In the timing abstraction model, five types of timing paths may carry timing characteristics of a circuit block that are needed for the timing analysis of a larger circuit containing the circuit block. The timing paths may include three timing paths from the maximum path simulation and two timing paths from the minimal path simulation. As mentioned above, the maximum path simulation will be described in detail. One skilled in the art will appreciate that the description applies to the minimal path simulation in a similar fashion, with the only exception that there may be no input-to-output path through sequential circuit elements.

FIG. 1 illustrates an exemplary minimal level sensitive timing abstraction model 100 with an input port 130, an output port 140, a setup check node 160, and a dummy latch node 170, which is controlled by a derived clock 110. The method for verifying the timing abstraction model may use an exemplary algorithm to compare timing runs in the timing abstraction model 100 with corresponding timing runs in the modeled circuit.

The exemplary verification algorithm may involve three steps. First, the exemplary verification algorithm identifies relevant timing paths to be compared in the timing abstraction model 100 as $path_1$ 101, $path_3$ 103, and $path_4$ 104. The relevant timing paths typically carry all the timing characteristics of a circuit block needed for the timing analysis of a larger circuit containing the circuit block. For example, $path_1$ 101 may be an input-to-setup check node path corresponding to a path in the modeled circuit that connects an input with the most critical clock-controlled node, $path_3$ 103 may be an input-to-output path corresponding to a path in the modeled circuit that connects an input port with an output port, and $path_4$ 104 may be a clock-to-output path corresponding to a path in the modeled circuit that is the most critical clock path leading to an output port.

Next, the exemplary verification algorithm identifies corresponding timing paths in the modeled circuit. The timing paths in the timing abstraction model are typically small subsets of the timing paths in the modeled circuit. The timing paths in the timing abstraction model and the modeled circuit are typically identified and selected independently of each other. For example, the most critical paths in the modeled circuit, which are the basis for obtaining the three parameters used to create the timing abstraction model, are typically selected independently of the path selection from the timing abstraction model. Independent selection of timing paths from the timing abstraction model and the modeled circuit may generate a more complete and reliable verification.

If several clock-to-output paths converge to an output port in the modeled circuit, the path with the latest signal arrival at the output port is typically identified as corresponding to the clock-to-output path in the timing abstraction model 100. Similarly, among all paths leaving a given input port in the modeled circuit, the path with the smallest timing slack, i.e., the path passing the most critical clock-controlled element, is typically identified as corresponding to the input-to-setup check node path in the timing abstraction model 100. The names of the starting and the ending nodes on the paths and the signal transition types on the nodes in the timing abstraction model 100 may be modified to correspond to those in the modeled circuit (described in detail later).

Finally, the exemplary verification algorithm compares timing slacks between the corresponding timing paths in the timing abstraction model 100 and in the modeled circuit. If the timing slacks are identical, the timing abstraction model passes verification. For example, $path_1$ 101 may verify the correctness of the required time, i.e., setup or hold check time, $path_3$ 103 may verify the accuracy of the input-to-output delay, and $path_4$ 104 may verify the correctness of the valid time, i.e., the most critical clock to output time.

All input-to-output delay in the timing abstraction model 100 may be simulated as a point-to-point delay between the setup check node 160 and the dummy latch node 170. Since there is typically zero delay between the input port 130 and the setup check node 160, and between the dummy latch node 170 and the output port 140, the entire input-to-output delay may be the point-to-point delay on the path section between the setup check node 160 and the dummy latch node 170. Accordingly, signals typically arrive at the same time at the dummy latch node 170 and at the output port 140 in the timing abstraction model 100. Since there is no corresponding path in the modeled circuit that behaves the same, $path_2$ 102, which is an input-to-dummy latch node path, may not have a corresponding path in the modeled circuit to compare.

In order to facilitate the comparison of the timing slacks, the node names, i.e., the starting and ending node names on all the relevant timing paths, of the timing abstraction model 100 may need to be modified to correspond to the node names in the modeled circuit, so that the timing paths may be compared based on the node names. In addition, signal transition types, i.e., rising (R) or falling (F), on the starting and ending nodes on all the relevant timing paths in the timing abstraction model 100 may need to be modified to correspond to the signal transition types in the modeled circuit. Hence, the name of the setup check node 160 attached to the input port 130 should correspond to the name of the most critical clock-controlled element on a path from the corresponding input port in the modeled circuit, i.e., the name of the clock-controlled element on which setup violation occurs at the earliest time. To generate a more complete and reliable verification, the name of the dummy latch node 170 attached to the output port 140 may correspond to the name of some clock-controlled element on the most critical clock-to-output path that leads to the corresponding output port in the modeled circuit.

The following paragraphs describe name modifications with respect to the setup check node 160. However, one skilled in the art should appreciate that name modifications of the dummy latch node may be achieved in a similar fashion.

For example, the name of the setup check node 160 in the timing abstraction model 100 corresponds to the name of the clock-controlled node in the modeled circuit on which the setup violation occurs at the earliest time. Several modifications may be required to achieve: 1) the correspondence between the setup check node 160 in the timing abstraction model 100 and the clock-controlled node in the modeled circuit, and 2) the uniqueness of node names for different setup/hold check nodes in the timing abstraction model. The name modifications may include splitting the setup check node 160 in the timing abstraction model 100 to several nodes and adopting a naming convention for the split nodes. For example, the setup check node 160 may be assigned a name formed by contestation of several strings. The name of the first string may be the name of the most critical node in the modeled circuit on which the violation first occurs. Other sub-strings may be appended to the first string to ensure that the node names are unique to avoid ambiguity.

The following is an example of a setup check node naming convention, where | is a separator character and a SH substring identifies a node as a setup/hold check node (to distinguish the node from a dummy latch node that may contain a DL substring instead).

setup_check_node_name=
clock_controlled_node_name|SH|input_port_name|controlling_clock_name|clock_edge The unique node names may assure correct path tracing in the STA running on a larger circuit containing the timing abstraction model 100. In the exemplary timing abstraction model verification algorithm, all characters after and including the first | separator may be stripped from the timing abstraction model node names. The resulted truncated names may be the same as the node names in the modeled circuit, enabling identification of the corresponding paths in the timing abstraction model 100 and in the modeled circuit.

FIGS. 2–8 illustrate several examples of name modifications of the setup check node 160 to enable verification of the exemplary minimal level sensitive timing abstraction model 100.

Figure 2:
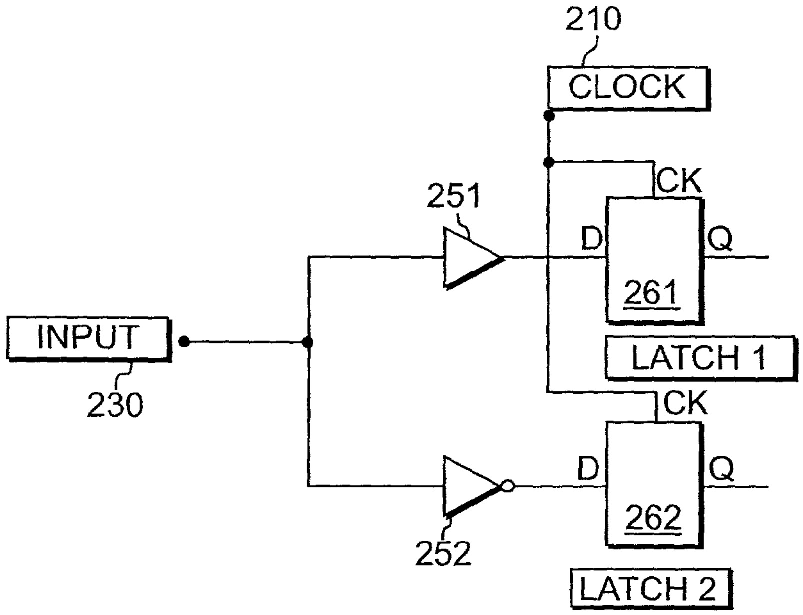
FIG. 2 illustrates a first exemplary modeled circuit where rising and falling transitions on a given input port cause earliest setup violations on different clock-controlled nodes in the modeled circuit.

FIG. 2 illustrates a first exemplary modeled circuit where the rising (R) and falling (F) signal transitions on an input port may cause earliest setup violations on different clock-controlled nodes in the modeled circuit. As a result, the setup check node 160 in the timing abstraction model 100 may need to be split into two nodes to correspond to the different clock-controlled nodes in the modeled circuit.

The first exemplary modeled circuit of FIG. 2 has an input port 230 and two latches $LATCH_1$ 261 and $LATCH_2$ 262, which are controlled by a same edge of a clock 210. Rising and falling signal transitions at the input port 230 may be represented as R and F, respectively. A buffer 251 connects the input port 230 with the $LATCH_1$ 261. Since no inverter exists between the input port 230 and the $LATCH_1$ 261, a rising edge of an input signal may propagate to the $LATCH_1$ 261 without change. For example, RR means a signal rising at the input port 230, and triggering a signal rising at the $LATCH_1$ 261. Similarly, FF means a signal falling at the input port 230, and triggering a signal falling at the $LATCH_1$ 261. On the other hand, an inverter 252 connects the input port 230 with the $LATCH_2$ 262, triggering a rising to falling inversion on the $LATCH_2$ 262.

The setup time may be calculated as follows. On the $LATCH_1$ 261, for example, the rising edge of the input 230 has a delay of 35 picoseconds and the falling edge has a delay of 25 picoseconds, then the setup time at the input port 230 is 35 picoseconds before the closing edge of the clock 210 for the RR transition and 25 picoseconds for the FF transition. The setup times are different for different transitions because the delays are different, due to the fact that P-type transistors switch slower than N-type transistors. On the $LATCH_2$ 262, assume the setup time at the input port 230 is 20 picoseconds for the RF transition and 30 picoseconds for the FR transition. Hence, the more critical setup time for the rising edge of signal at the input port 230 is due to the $LATCH_1$ 261, whereas the more critical setup time for the falling edge of signal at the input port 230 is due to the $LATCH_2$ 262.

Since different critical latches in the modeled circuit determine the setup time for different signal transitions of the given input port, splitting of the setup check node 160 may be needed in the timing abstraction model 100.

Figure 3:
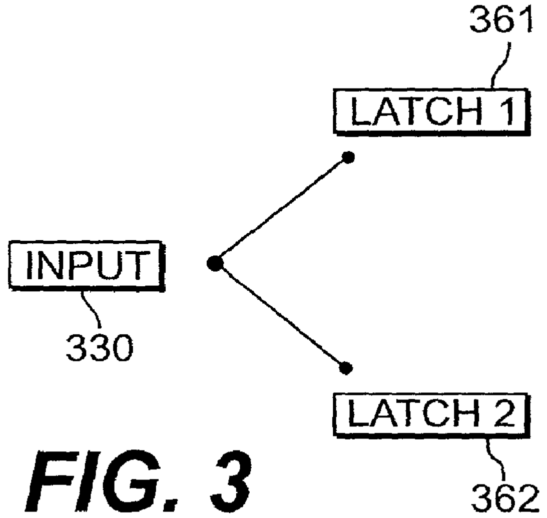
FIG. 3 shows splitting of the setup check node in the exemplary timing abstraction model to multiple nodes for the first exemplary modeled circuit illustrated in FIG. 2.

FIG. 3 illustrates an exemplary splitting of the setup check node 160 in the timing abstraction model 100 for the first exemplary modeled circuit shown in FIG. 2, and an exemplary naming convention for the split nodes. To preserve the node name of the most critical clock-controlled node in the modeled circuit, rising signal transition at the input port 330 will pass the setup check node $LATCH_1$ 361 that corresponds to the $LATCH_1$ 261 in the modeled circuit. Likewise, a falling signal transition at the input port will pass the setup check node $LATCH_2$ 362 that corresponds to the $LATCH_2$ 262 in the modeled circuit.

Figure 4A:
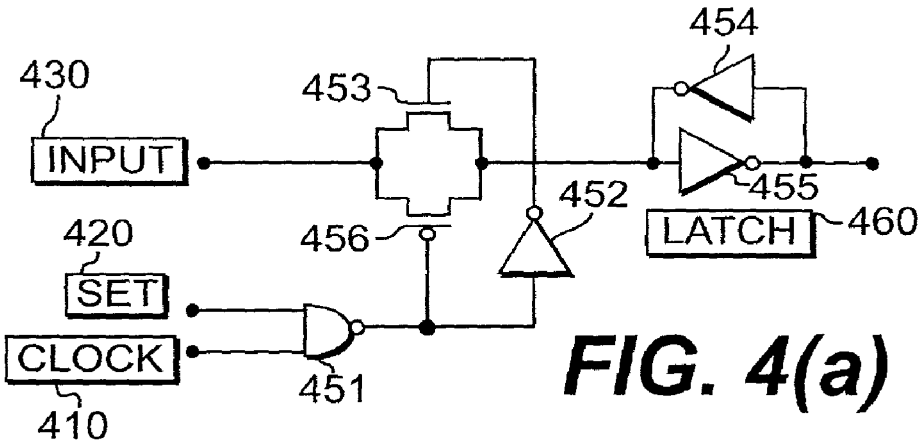
FIG. 4(*a*) illustrates a second exemplary modeled circuit where rising and falling signal transitions on a given input port cause earliest setup violations on the same clock-controlled node in the modeled circuit, but have setup times related to different clock edges.
Figure 4B:
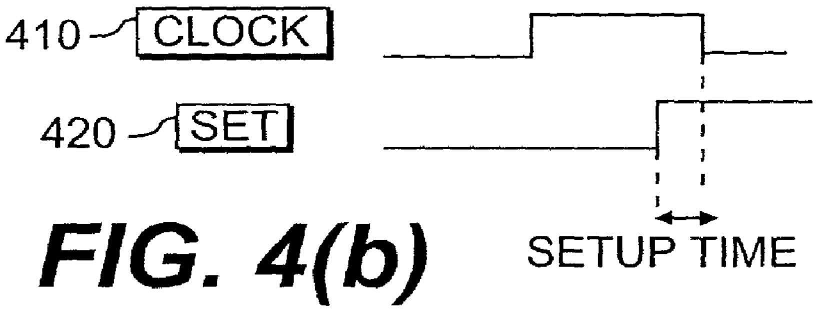
Figure 4C:
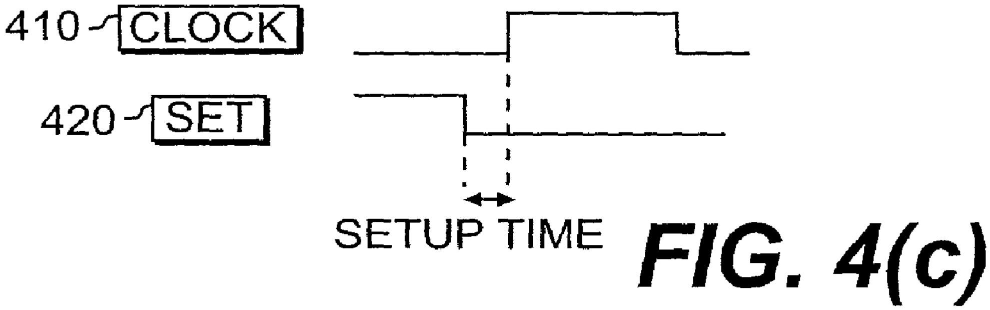

FIG. 4(*a*) illustrates a second exemplary modeled circuit where rising and falling signal transitions on the input port may cause earliest setup violations on the same clock-controlled node in the modeled circuit, but may have setup times related to different clock edges.

The second exemplary modeled circuit of FIG. 4(*a*) has an input port 430, which is connected to a pair of pass transistors 453, 456, and back-to-back inverters 454, 455 that form a latch 460. A clock signal 410 is gated by a "set" control signal from the input port 420 through a nand gate 451. If the clock signal is low, the pair of transistors 453, 456 are closed, and the input signal from the input port 430 does not propagate to the latch 460. As a result, the latch 460 holds the previously transmitted value. If the clock signal transits to high, both of the transistors 453, 456 are open, and the input signal is allowed to pass through the latch 460.

Times when the signal at the "set" input port 420 may transition from logical low level to logical high level and vice versa are subject to setup constraints with respect to the clock signal. The "set" signal from the input port 420 must enable the clock before the clock signal goes low and must disable the clock before the clock signal goes high. Accordingly, the rising edge of the "set" signal must come before the falling edge of the clock signal, as shown in FIG. 4(*b*). Similarly, the falling edge of the "set" signal must come before the rising edge of the clock signal, as shown in FIG. 4(*c*). Accordingly, rising and falling signal transitions on the "set" input port 420 may cause earliest setup violations on the same clock-controlled node in the modeled circuit, but will have setup times related to different clock edges.

In the timing abstraction model 100, a separate setup check node 160 may be used for each controlling clock edge to ensure correct advancing of a cycle count as a signal propagates through the timing abstraction model boundaries in circuits with multiple controlling clocks and clock edges. Accordingly, two setup check nodes in the timing abstraction model 100 may correspond to one clock-controlled node in the modeled circuit. The names of these two setup check nodes may be modified to be unique and to bear correspondence with the name of the clock-controlled node in the modeled circuit.

Figure 5:
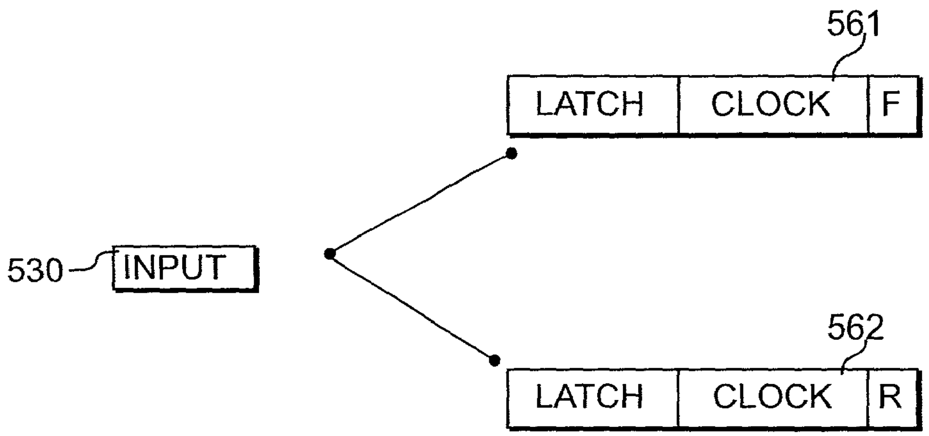
FIG. 5 shows naming of the setup check nodes in the exemplary timing abstraction model for the second exemplary modeled circuit illustrated in FIG. 4, where the clock name and the clock edge are appended to the latch name to assure unique names for all setup check nodes.

FIG. 5 illustrates an exemplary splitting of the setup check node 160 in the timing abstraction model 100 for the second exemplary modeled circuit shown in FIG. 4, and an exemplary naming convention for the split nodes with input port 530. For example, appending the controlling clock pin name and clock edge type to the clock-controlled node name may provide unique names for the setup check nodes, i.e. LATCH|CLOCK|F 561 and LATCH|CLOCK|R 562. The splitting of the setup check nodes is necessary because two different reference clock edges control different signal edges.

Figure 6:
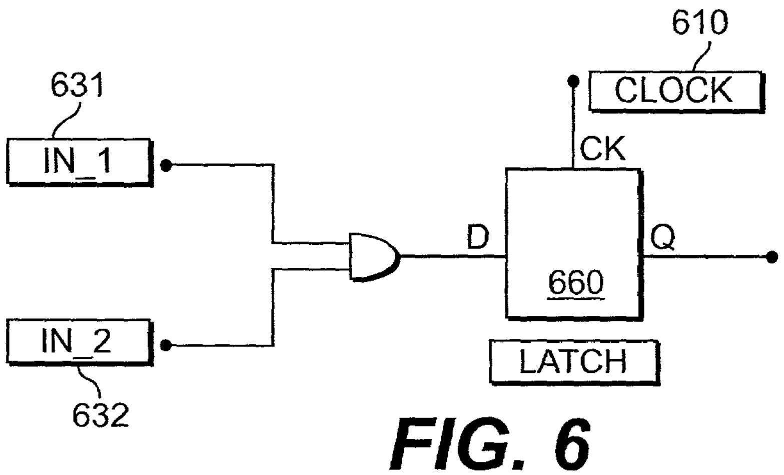
FIG. 6 illustrates a third exemplary modeled circuit where the critical paths from several different inputs cause earliest setup violations on the same clock-controlled node.

FIG. 6 illustrates a third exemplary modeled circuit where the most critical paths from two different input ports may cause earliest setup violations on the same clock-controlled node in the modeled circuit.

The third exemplary circuit of FIG. 6 has two input ports, i.e., IN_1 631 and IN_2 632, connecting with one single latch 660, which is controlled by a clock 610. In this example, the most critical paths from both input ports 631, 632 may cause earliest setup violations on the latch 660. Since zero time delay exists between input ports and setup check nodes in the timing abstraction model 100, two different setup check nodes may be needed to be associated with the two different inputs IN_1 631 and IN_2 632, respectively. To facilitate model verification, the names of both these setup check nodes may need to correspond to the name of the latch 660 in the modeled circuit. Again, to preserve the naming in the modeled circuit, additional string may be appended to the latch names to eliminate ambiguity.

Figure 7:
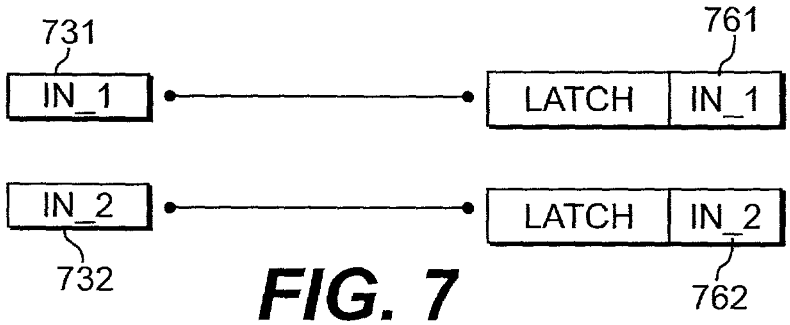
FIG. 7 shows naming of the setup check nodes in the exemplary timing abstraction model for the third exemplary modeled circuit illustrated in FIG. 6, where the input name is appended to the latch name to assure unique names for all setup check nodes.

FIG. 7 illustrates an exemplary splitting of the setup check node 160 in the timing abstraction model 100 for the third exemplary modeled circuit shown in FIG. 6, and an exemplary naming convention for the split nodes. For example, appending an input pin name to the clock-controlled node name may provide unique names for the setup check nodes, i.e., LATCH|IN_1 761 and LATCH|IN_2 762. For the input port IN_1 731 and IN_2 732.

Figure 8:
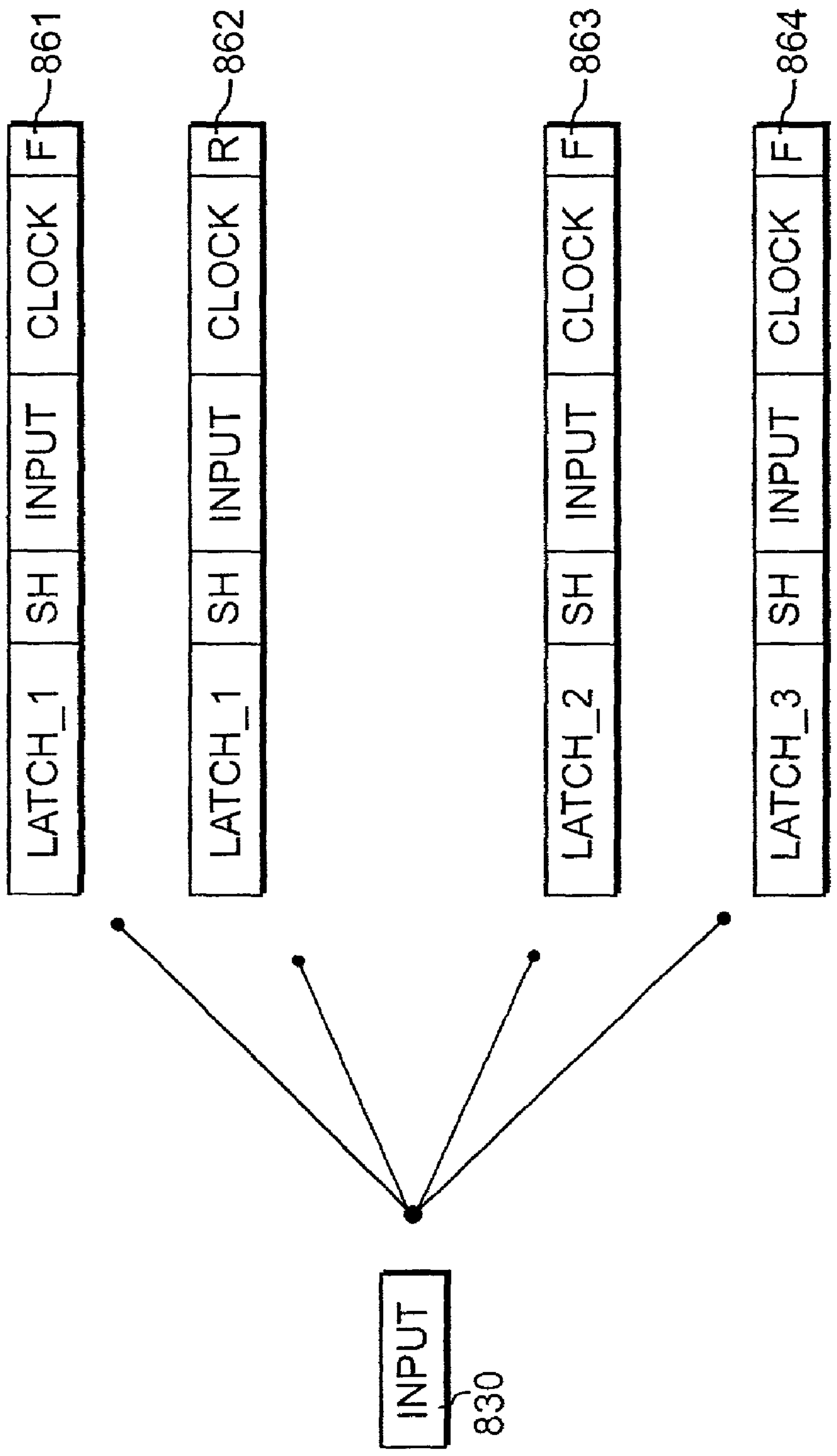
FIG. 8 summarizes the examples shown in FIGS. 2–5, where the node naming convention includes appending to the name of the most critical sequential element the input name, the controlling clock name and edge, and the SH string to assure unique names for all setup/hold check nodes and to distinguish the setup/hold check nodes from the dummy latch nodes.

FIG. 8 is an exemplary timing abstraction model extension that summarizes the examples shown in FIGS. 2–5. Multiple setup and hold check nodes may be connected to an input port 830. The setup and hold check nodes may be named in accordance with the naming convention described above. For example, if the most critical clock-controlled node in the modeled circuit with respect to the setup violation is LATCH_1, the setup check node 160 in the timing abstraction model 100 may need to be split into two setup check nodes, i.e., LATCH_1|SH|INPUT|CLOCK|F 861 and LATCH_1|SH|INPUT|CLOCK|R 862, when the setup times for rising and falling signal transitions at the input port 830 are related to different reference clocks or reference clock edges, similar to the example illustrated in FIGS. 4 and 5. The |CLOCK|F and |CLOCK|R substrings are appended to the latch name to eliminate node name ambiguity. The LATCH_1|SH|INPUT|CLOCK|F 861 may have RR or RF connections and the LATCH_1|SH|INPUT|CLOCK|R 862 may have FR or FF connections. Similarly, if the most critical clock-controlled node in the modeled circuit with respect to the hold violations is LATCH_2 for the rising input transition and LATCH_3 for the falling input transition, the hold check node 160 in the timing abstraction model 100 may need to be split to two hold check nodes, i.e., LATCH_2|SH|INPUT|CLOCK|F 863 and LATCH_3|SH|INPUT|CLOCK|F 864, because different edges of an input signal pass through different latches in the modeled circuit, similar to the example illustrated in FIGS. 2 and 3. The LATCH_2|SH|INPUT|CLOCK|F 863 may have RR or RF connections and the LATCH_3|SH|INPUT|CLOCK|F 864 may have FR or FF connections.

One skilled in art should appreciate that modifications of the dummy latch node names may be performed in a similar fashion. Instead of the |SH substring, the dummy latch nodes may have a |DL substring in the node names to distinguish them from the setup/hold check nodes.

The following is an exemplary timing abstraction model verification algorithm.

Loop over Input ports IN_m
- Loop over rising (R) and falling (F) transition types at Input port IN_m
  - Clear list ModelPaths[RCLK_p], where RCLK_p designates reference clock and edge
  - Loop over reference clocks and edges RCLK_p
    - Get the IN_m→SetupCheckNode path from the model where the SetupCheckNode is controlled by the reference clock and edge RCLK_p. If such path exists in the model, add this path to list ModelPaths[RCLK_p]
  - End loop over reference clocks and edges RCLK_p
  - Clear list CircuitPaths[RCLK_p]
  - For a given IN_m, loop over IN_m→ClockedNode paths in the modeled circuit
  - (ClockedNode=Latch, PrechargeNode, UserDefinedSetupCheck, etc.)
    - Get the reference clock RCLK_p controlling the first clock-controlled element on the IN_m→ClockedNode path
    - If this IN_m→ClockedNode path has smaller slack than the path in list element CircuitPaths[RCLK_p], store the IN_m→ClockedNode path in CircuitPaths[RCLK_p]
  - End loop over IN_m→ClockedNode paths
  - Loop over reference clocks and edges RCLK_p
    - Are the CircuitPaths[RCLK_p].ClockedNode name and the truncated ModelPaths[RCLK_p].SetupCheckNode name equal?

```
        If not:
        Report critical path discrepancy
        If yes:
        Compare slacks for the IN_m→CircuitPaths[RCLK_p].ClockedNode path from the modeled circuit and the IN_m→ModelPaths[RCLK_p].SetupCheckNode path from the model
        Are both slacks equal?
          If not, report slack discrepancy. If slack in the model is smaller than slack in the modeled circuit, this may be O.K. for a non-transparent input stimulus
    End loop over reference clocks and edges RCLK_p
    Loop over Output ports OUT_n
      Loop over rising (R) and falling (F) transition types at Output port OUT_n
      Compare slacks for the IN_m→OUT_n timing paths in the model and in the modeled circuit
      Are both slacks equal?
        If not, report slack discrepancy
      End loop over rising (R) and falling (F) transition types at Output port OUT_n
    End Loop over Output ports OUT_n
  End loop over rising (R) and falling (F) transition types at Input port IN_m
End Loop over Input ports IN_m
Loop over Output ports OUT_n
  Loop over rising (R) and falling (F) transition types at Output port OUT_n
    Clear list ModelPaths[RCLK_q], where RCLK_q designates reference clock and edge
    Loop over reference clocks and edges RCLK_q
      Get the Clock→OUT_n path from the model where Clock is derived from the reference clock and edge RCLK_q. If such path exists in the model, add this path to list ModelPaths[RCLK_q]
    End loop over RCLK_q
    Clear list CircuitPaths[RCLK_q]
    For a given OUT_n, loop over Clock→OUT_n paths in the modeled circuit
      Get the reference clock RCLK_q controlling the last clock-controlled element on the Clock→OUT_n path
      If this Clock→OUT_n path has smaller slack (i.e., a later signal arrival at output OUT_n) than the path in list element CircuitPaths[RCLK_q], store the Clock→OUT_n path in CircuitPaths[RCLK_q]
    End loop over Clock→OUT_n paths
    Loop over reference clocks and edges RCLK_q
      Are the Clock names on the Clock→OUT_n paths equal in the model (on path stored in list element ModelPaths[RCLK_q]) and in the modeled circuit (on path stored in list element CircuitPaths[RCLK_q])? Is the ModelPaths[RCLK_q].DummyLatch dummy latch node name in the model equal to the name of some clock-controlled element on path CircuitPaths[RCLK_q] in the modeled circuit?
        If not:
        Report critical path discrepancy
        If yes:
        Compare slacks for the Clock→OUT_n paths in list element ModelPaths[RCLK_q] in the model and in the list element CircuitPaths[RCLK_q] in the modeled circuit
          Are both slacks equal?
          If not, report slack discrepancy
      End loop over reference clocks and edges RCLK_q
    End loop over rising (R) and falling (F) transition types at Output port OUT_n
  End loop over Output ports OUT_n
```

The exemplary verification algorithm includes three sections. In the first section, the exemplary verification algorithm compares input→setup check node paths in the timing abstraction model 100 with corresponding input→clock-controlled node paths in the modeled circuit. In a loop over input ports IN_m, the IN_m→SetupCheckNode paths may be first identified for the input ports IN_m. The setup check node names may be easily distinguished from other node names in the timing abstraction model 100 because of the |SH| substring in the node name string. For each input port IN_m, multiple IN_m SetupCheckNode paths may be categorized to list ModelPaths according to the reference clocks and edges RCLK_p that control the different setup check nodes attached to the single input port. Then, in a loop over all paths in the modeled circuit that start at input ports IN_m and end at clock-controlled nodes, the IN_m→clock-controlled node paths are categorized to list CircuitPaths according to the reference clocks and edges RCLK_p controlling the first clock-controlled elements along the path. For each reference clock RCLK_p an IN_m→clock-controlled node path that has the smallest timing slack may be identified.

Next, the exemplary verification algorithm checks, for each reference clock and edge RCLK_p, whether the clock-controlled node name on the path in the modeled circuit is equal to the truncated setup check node name from the timing abstraction model 100. The truncated node name may be stripped of all characters after and including the first | separator character. If the names do not match, an error may be reported stating that the timing abstraction model 100 contains a wrong IN_m→SetupCheckNode critical path. The error may occur if an unusual latch or a dynamic logic element in the modeled circuit is not well understood by the STA tool, or if some parameters extracted in the timing abstraction model building process are wrong. On the other hand, if the names match, the timing slacks may be compared for the two corresponding paths. If the timing slacks are different, an error may be reported stating that the timing slack on the IN_m→SetupCheckNode path in the timing abstraction model 100 is wrong. In the case of a non-transparent input stimulus, the timing slack in the timing abstraction model may be smaller than the timing slack in the modeled circuit.

In the second section, the exemplary verification algorithm compares input→output paths between the timing abstraction model 100 and the modeled circuit. In nested loops over the input ports IN_m and output ports OUT_n, timing slacks between the corresponding IN_m→OUT_n paths in the timing abstraction model 100 and in the modeled circuit may be compared.

In the third section, the exemplary verification algorithm compares clock→output port paths in the timing abstraction model 100 and in the modeled circuit. In a loop over the output ports OUT_n, the Clock→OUT_n paths may be first identified for the output ports OUT_n in the timing abstraction model 100. For each output port OUT_n, multiple Clock→OUT_n paths may be categorized to list ModelPaths according to the reference clocks and edges RCLK_q from which the Clock is derived. Then, in a loop over all paths in the modeled circuit that start at any clock port and end at the given output port OUT_n, the Clock→OUT_n paths are categorized to list CircuitPaths according to the reference clocks and edges $RCLK_{q}$ controlling the last clock-controlled elements along the path. For each reference clock $RCLK_{q}$ a Clock→$OUT_{n}$ path that has the latest signal arrival at the output port $OUT_{n}$ may be identified.

Next, the exemplary verification algorithm checks, for each reference clock and edge $RCLK_{q}$, whether the Clock nodes on the Clock→$OUT_{n}$ paths have equal names in the timing abstraction model 100 and in the modeled circuit and whether the dummy latch node name in the model matches the name of some clock-controlled element on the corresponding Clock→$OUT_{n}$ path in the modeled circuit. If the names do not match, an error may be reported stating that the timing abstraction model 100 contains the wrong Clock→$OUT_{n}$ critical path. On the other hand, if the names match, the timing slack may be compared for the two corresponding paths. If the slacks are different, an error may be reported stating that the timing slack on the Clock→$OUT_{n}$ path in the timing abstraction model 100 is wrong.

Figure 9:
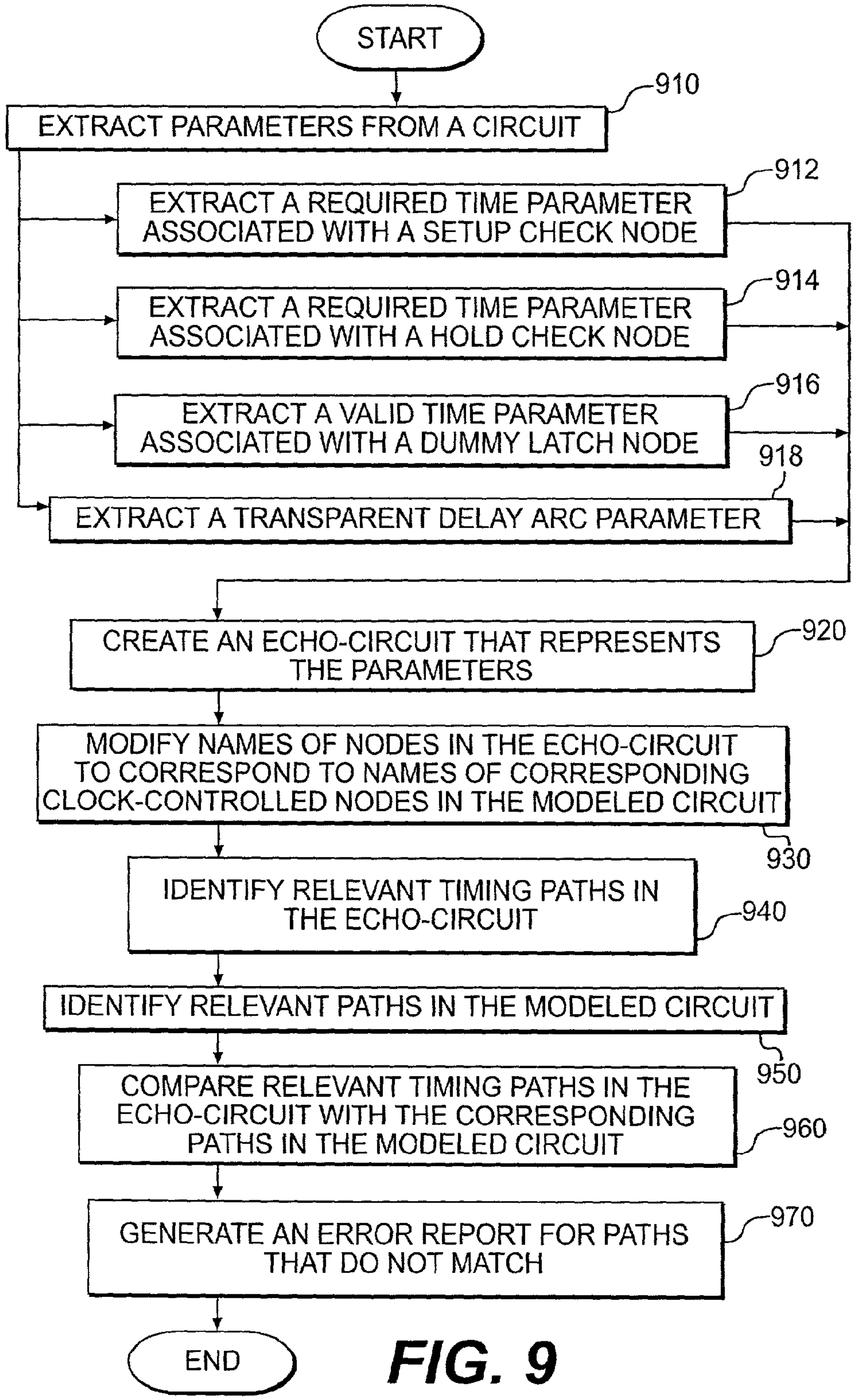
FIG. 9 is a flow chart illustrating an exemplary method for verifying a minimal level sensitive timing abstraction model.

FIG. 9 is a flow chart illustrating an exemplary method for verifying a minimal level sensitive timing abstraction model 100. First, parameters may be extracted from a modeled circuit that includes sequential elements, such as latches or domino logics, controlled by clock elements, step 910. The parameters to be extracted may include a required time parameter associated with a setup check node, step 912, a required time parameter associated with a hold check node, step 914, a valid time parameter associated with a dummy latch node, step 916, or a transparent delay arc parameter, step 918. Next, an echo-circuit, i.e., a timing abstraction model 100, may be created to represent the parameters, step 920. The echo-circuit may enable a signal to propagate from an input port to an output port only if the signal arrives at the output port later than a clock signal from the most critical clock element controlling the output port.

Next, names of the nodes in the echo-circuit are modified to correspond to names of the corresponding clock-controlled elements in the modeled circuit, step 930. After the names are modified, the exemplary method uses an exemplary verification algorithm to verify the timing abstraction model 100. First, the exemplary verification algorithm identifies relevant timing paths to be compared in the echo-circuit, step 940. Next, the exemplary verification algorithm identifies relevant paths in the modeled circuit, step 950. Finally, the exemplary verification algorithm compares the relevant timing paths, i.e., timing slacks, in the echo-circuit with the corresponding paths in the modeled circuit, step 960. If the timing slacks are identical, the timing abstraction model 100 passes verification. Otherwise, an error report may be generated for paths that do not match, step 970.

Figure 10:
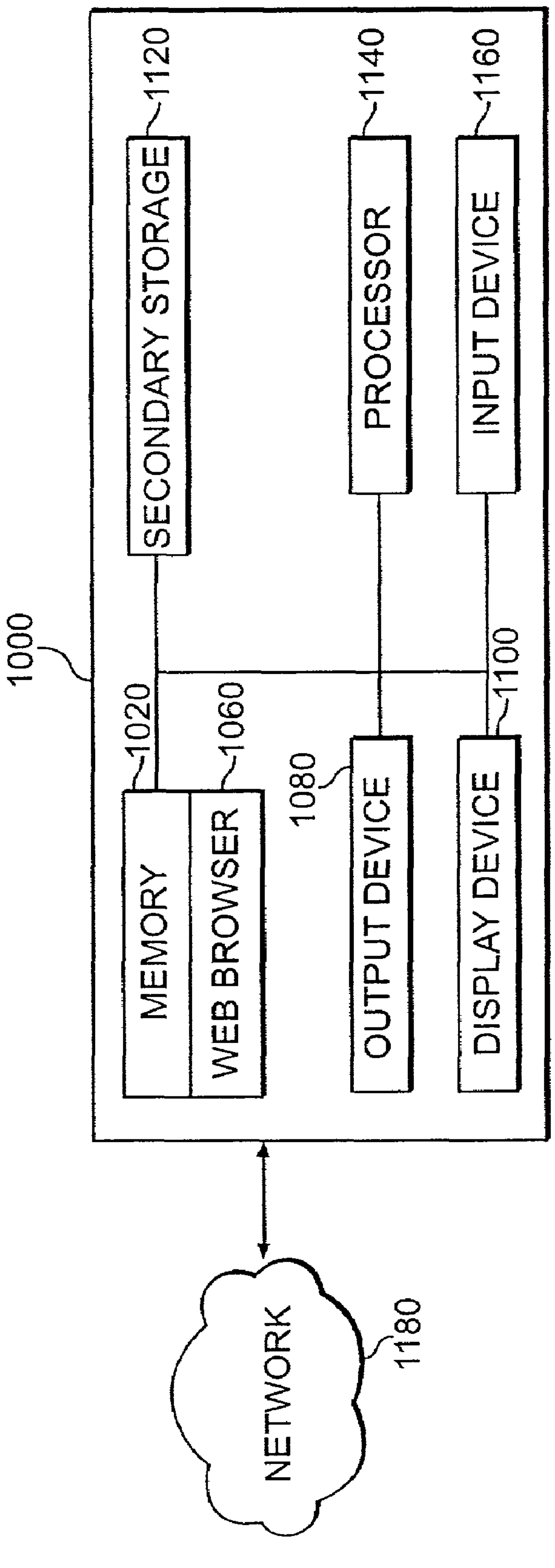
FIG. 10 illustrates exemplary hardware components of a computer that may be used in connection with the method for verifying a minimal level sensitive timing abstraction model.

FIG. 10 illustrates exemplary hardware components of a computer 1000 that may be used in connection with the method for verifying a minimal level sensitive timing abstraction model 100. The computer 1000 includes a connection with a network 1180 such as the Internet or other type of computer or telephone networks. The computer 1000 typically includes a memory 1020, a secondary storage device 1120, a processor 1140, an input device 1160, a display device 1100, and an output device 1080.

The memory 1020 may include random access memory (RAM) or similar types of memory. The memory 1020 may be connected to the network 1180 by a web browser 1060. The web browser 1060 makes a connection by way of the world wide web (WWW) to other computers, and receives information from the other computers that is displayed on the computer 1000. Information displayed on the computer 1000 is typically organized into pages that are in binary or text (ASCII) format or are constructed using specialized language, such as HTML or XML. The secondary storage device 1120 may include a hard disk drive, floppy disk drive, CD-ROM drive, or other types of non-volatile data storage, and may correspond with various databases or other resources. The processor 1140 may execute information stored in the memory 1020, the secondary storage 1120, or received from the Internet or other network 1180. The input device 1160 may include any device for entering data into the computer 1000, such as a keyboard, key pad, cursor-control device, touch-screen (possibly with a stylus), or microphone. The display device 1100 may include any type of device for presenting visual image, such as, for example, a computer monitor, flat-screen display, or display panel. The output device 1080 may include any type of device for presenting data in hard copy format, such as a printer, and other types of output devices include speakers or any device for providing data in audio form. The computer 1000 can possibly include multiple input devices, output devices, and display devices.

Although the computer 1000 is depicted with various components, one skilled in the art will appreciate that the computer 1000 can contain additional or different components. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling the computer 1000 to perform a particular method.

While the method and apparatus for verifying a minimal level sensitive timing abstraction model have been described in connection with an exemplary embodiment, those skilled in the art will understand that many modifications in light of these teachings are possible, and this application is intended to cover any variations thereof.

What is claimed is:

1. A method for verifying a minimal level sensitive timing abstraction model, comprising:

extracting a plurality of parameters from a modeled circuit that includes sequential elements controlled by internally generated clock signals;

creating an echo-circuit that represents the plurality of parameters with nodes and time arcs, wherein the echo-circuit is stimulus independent, port-based, has no internal latch nodes, and is used in any static timing analysis (STA) tools, wherein the echo-circuit includes a dummy latch node that is controlled by an internally generated clock signal that becomes active when a latest clock signal from the circuit arrives at the output port, and wherein the echo-circuit enables a signal to propagate from an input port to an output port only if the signal arrives at the output port later than a latest clock signal from any pin clock signal controlling the output port;

identifying relevant timing paths in the echo-circuit, wherein the relevant timing paths are associated with the plurality of parameters;

identifying paths in the modeled circuit that connect sequential elements and correspond to the relevant timing paths in the echo-circuit; and comparing the relevant timing paths in the echo-circuit with the corresponding paths in the modeled circuit.

2. The method of claim 1, wherein the extracting the plurality of parameters step includes extracting a required time parameter associated with a setup check node.

3. The method of claim 1, wherein the extracting the plurality of parameters step includes extracting a required time parameter associated with a hold check node.

4. The method of claim 1, wherein the extracting the plurality of parameters step includes extracting a valid time parameter associated with the dummy latch node.

5. The method of claim 1, wherein the extracting the plurality of parameters step includes extracting a transparent delay arc parameter that represents a time delay a signal passes from an input port to an output port of the modeled circuit.

6. The method of claim 1, further comprising modifying names of the nodes in the echo-circuit to correspond to names of corresponding sequential elements in the modeled circuit.

7. The method of claim 1, further comprising generating an error report if the relevant timing paths in the echo-circuit do not match the corresponding paths in the modeled circuit.

8. The method of claim 1, wherein the creating the echo-circuit step includes creating a timing abstraction model that has level triggered latches.

9. An apparatus for verifying a minimal level sensitive timing abstraction model, comprising:

means for extracting a plurality of parameters from a modeled circuit that includes sequential elements controlled by internally generated clock signals;

means for creating an echo-circuit that represents the plurality of parameters with nodes and time arcs, wherein the echo-circuit is stimulus independent, port-based, has no internal latch nodes, and is used in any static timing analysis (STA) tools, wherein the echo-circuit includes a dummy latch node that is controlled by an internally generated clock signal that becomes active when a latest clock signal from the circuit arrives at the output port, and wherein the echo-circuit enables a signal to propagate from an input port to an output port only if the signal arrives at the output port later than a latest clock signal from any pin clock signal controlling the output port;

means for identifying relevant timing paths in the echo-circuit, wherein the relevant timing paths are associated with the plurality of parameters;

means for identifying paths in the modeled circuit that connect sequential elements and correspond to the relevant timing paths in the echo-circuit; and means for comparing the relevant timing paths in the echo-circuit with the corresponding paths in the modeled circuit.

10. The apparatus of claim 9, further comprising means for modifying names of the nodes in the echo-circuit to correspond to names of corresponding sequential elements in the modeled circuit.

11. The apparatus of claim 9, further comprising means for generating an error report if the relevant timing paths in the echo-circuit do not match the corresponding paths in the modeled circuit.

12. A computer readable medium providing instructions for verifying a minimal level sensitive timing abstraction model, the instructions comprising:

extracting a plurality of parameters from a modeled circuit that includes sequential elements controlled by internally generated clock signals;

creating an echo-circuit that represents the plurality of parameters with nodes and time arcs, wherein the echo-circuit is stimulus independent, port-based, has no internal latch nodes, and is used in any static timing analysis (STA) tools, wherein the echo-circuit includes a dummy latch node that is controlled by an internally generated clock signal that becomes active when a latest clock signal from the circuit arrives at the output port, and wherein the echo-circuit enables a signal to propagate from an input port to an output port only if the signal arrives at the output port later than a latest clock signal from any pin clock signal controlling the output port;

identifying relevant timing paths in the echo-circuit, wherein the relevant timing paths are associated with the plurality of parameters;

identifying paths in the modeled circuit that connect sequential elements and correspond to the relevant timing paths in the echo-circuit; and comparing the relevant timing paths in the echo-circuit with the corresponding paths in the modeled circuit.

13. The computer readable medium of claim 12, further comprising instructions for modifying names of the nodes in the echo-circuit to correspond to names of corresponding sequential elements in the modeled circuit.

14. The computer readable medium of claim 12, further comprising instructions for generating an error report if the relevant timing paths in the echo-circuit do not match the corresponding paths in the modeled circuit.

15. The computer readable medium of claim 12, wherein the instructions for extracting the plurality of parameters step includes instructions for extracting a required time parameter associated with a setup check node.

16. The computer readable medium of claim 12, wherein the instructions for extracting the plurality of parameters step includes instructions for extracting a required time parameter associated with a hold check node.

17. The computer readable medium of claim 12, wherein the instructions for extracting the plurality of parameters step includes instructions for extracting a valid time parameter associated with the dummy latch node.

18. The computer readable medium of claim 12, wherein the instructions for extracting the plurality of parameters step includes instructions for extracting a transparent delay arc parameter that represents a time delay a signal passes from an input port to an output port of the modeled circuit.

* * * * *

UNITED STATES PATENT AND TRADEMARK OFFICE

CERTIFICATE OF CORRECTION

PATENT NO. : 6,996,515 B1
APPLICATION NO. : 09/927204
DATED : February 7, 2006
INVENTOR(S) : Martin Foltin et al.

It is certified that error appears in the above-identified patent and that said Letters Patent is hereby corrected as shown below:

In column 10, line 33, delete “Cycles” and insert -- $Cycle_J$ --, therefor.

In column 10, line 37, delete “C,” and insert -- $C_J$ --, therefor.

Signed and Sealed this

Second Day of June, 2009

JOHN DOLL
*Acting Director of the United States Patent and Trademark Office*